US009069388B2

(12) United States Patent
Karhiniemi et al.

(10) Patent No.: US 9,069,388 B2
(45) Date of Patent: Jun. 30, 2015

(54) KEYPAD APPARATUS

(75) Inventors: Marko Karhiniemi, Espoo (FI); Juhani Tuovinen, Espoo (FI)

(73) Assignee: Nokia Corporation, Espoo (FI)

( * ) Notice: Subject to any disclaimer, the term of this patent is extended or adjusted under 35 U.S.C. 154(b) by 345 days.

(21) Appl. No.: 13/125,624

(22) PCT Filed: Oct. 31, 2008

(86) PCT No.: PCT/FI2008/050623
§ 371 (c)(1),
(2), (4) Date: May 10, 2011

(87) PCT Pub. No.: WO2010/049577
PCT Pub. Date: May 6, 2010

(65) Prior Publication Data
US 2011/0221680 A1  Sep. 15, 2011

(51) Int. Cl.
*G06F 3/02* (2006.01)
*G06F 3/044* (2006.01)
*H03K 17/96* (2006.01)
*H03K 17/975* (2006.01)
*G06F 3/03* (2006.01)

(52) U.S. Cl.
CPC ............... *G06F 3/0202* (2013.01); *G06F 3/03* (2013.01); *G06F 3/044* (2013.01); *H01H 2239/006* (2013.01); *H03K 17/962* (2013.01); *H03K 17/975* (2013.01); *H03K 2217/960775* (2013.01)

(58) Field of Classification Search
USPC .......................................... 345/173; 200/600
See application file for complete search history.

(56) References Cited

U.S. PATENT DOCUMENTS

| 4,288,836 | A | * | 9/1981 | Thornburg et al. | ........... | 200/600 |
| 5,225,959 | A | | 7/1993 | Stearns | | |
| 6,970,126 | B1 | | 11/2005 | O'Dowd et al. | | |
| 7,172,822 | B2 | * | 2/2007 | Shibata | ........................ | 428/690 |
| 2007/0229470 | A1 | * | 10/2007 | Snyder et al. | .................. | 345/173 |
| 2007/0296709 | A1 | * | 12/2007 | GuangHai | ..................... | 345/173 |
| 2008/0042978 | A1 | | 2/2008 | Perez-Noguera | | |
| 2008/0136792 | A1 | * | 6/2008 | Peng et al. | ..................... | 345/174 |
| 2008/0202824 | A1 | | 8/2008 | Philipp et al. | | |
| 2008/0218494 | A1 | * | 9/2008 | Perski et al. | .................. | 345/174 |
| 2009/0008234 | A1 | * | 1/2009 | Tolbert et al. | ................. | 200/600 |

FOREIGN PATENT DOCUMENTS

WO   WO2005019987   3/2005

OTHER PUBLICATIONS

PCT International Search Report of PCT/FI2008/050623—Date of Completion of Search: Jul. 29, 2009, 5 pages.
PCT Written Opinion of the International Searching Authority of PCT/FI2008/050623—Date of Completion of Opinion: Jul. 29, 2009, 6 pages.

* cited by examiner

*Primary Examiner* — Sahlu Okebato
(74) *Attorney, Agent, or Firm* — Locke Lord LLP

(57) ABSTRACT

The disclosure relates to implementing different key types on a keypad or keyboard. The implementation can be enabled e.g. by an apparatus including a substrate (28) including a capacitive sensor element (29), the capacitive sensor element having a first electrode (24) forming a first capacitor with an object touching or coming into proximity of the first electrode, wherein the capacitive sensor element is configured to generate a first signal responsive to the object touching or coming into proximity of the capacitive sensor element, a first capacitor circuit coupled to at least the first electrode, and a dome (26) configured to complete, responsive to the dome being depressed, an electric circuit including at least the first capacitor and the first capacitor circuit to form a second capacitor circuit, wherein the second capacitor circuit is configured to generate a second signal.

14 Claims, 5 Drawing Sheets

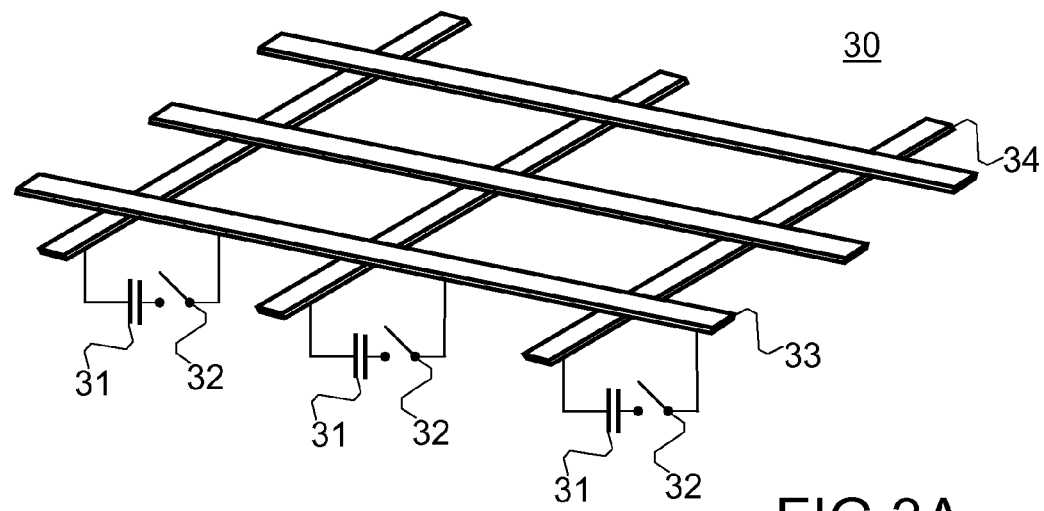
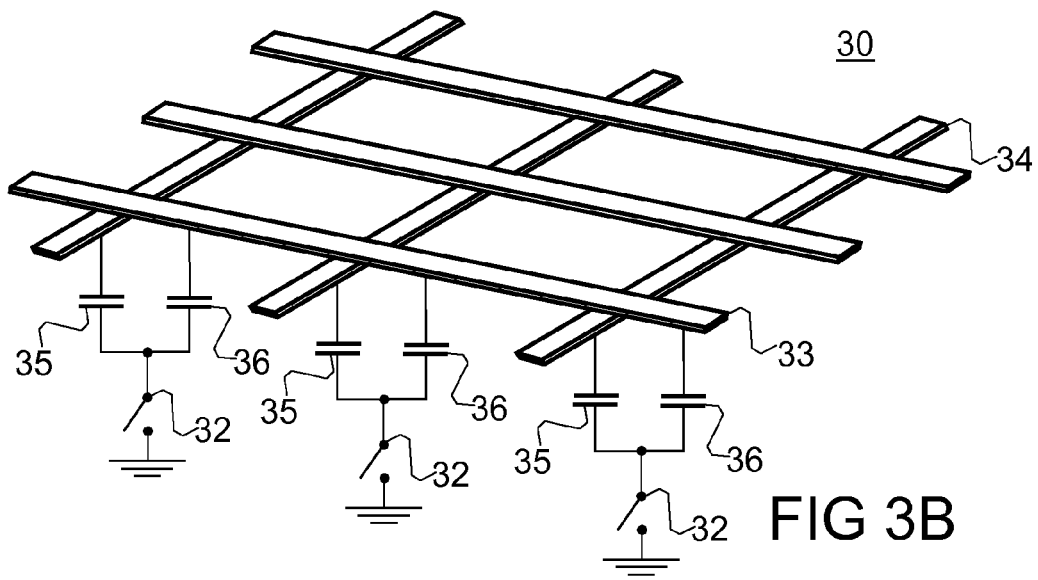

KEYPAD APPARATUS

FIELD OF THE INVENTION

The present invention relates in general to keypads or keyboards of electronic devices and in particular, but not exclusively, to implementing different key types on a keypad or keyboard.

BACKGROUND OF THE INVENTION

Presently, the tendency in designing and manufacturing electronic devices, such as mobile phones, personal digital assistants, handheld computers, and the like is to make the electronic devices increasingly smaller in size. On the other hand, today's electronic devices typically provide a rich set of features, which imposes requirements on the user interfaces of the devices.

Traditionally, electronic devices have been provided with keys that are activated by depressing them. Nowadays, electronic devices may also be equipped with touch keys in addition or alternatively to press keys. Additionally, touch keys and different press keys with force activation can be used in combination in virtual keys and keyboards, sliders, touch pads, and the like.

SUMMARY

If an electronic device is provided with both press keys and touch keys, today's keypad assemblies include a dedicated flexible printed circuit board and a controller for each of the key types, resulting in two flexible printed circuit boards and two controllers in an assembly that includes both types of keys. These types of designs may increase the size, especially thickness, and cost of keypad assemblies in electronic devices.

Particular embodiments of the invention aim at addressing at least some of the issues discussed above. According to a first aspect of the invention there is provided an apparatus comprising a substrate comprising a capacitive sensor element, said capacitive sensor element having a first electrode forming a first capacitor with an object touching or coming into proximity of the first electrode, wherein the capacitive sensor element is configured to generate a first signal responsive to the object touching or coming into proximity of the capacitive sensor element, a first capacitor circuit coupled to at least the first electrode, and a dome configured to complete, responsive to the dome being depressed, an electric circuit comprising at least the first capacitor and the first capacitor circuit to form a second capacitor circuit, wherein the second capacitor circuit is configured to generate a second signal.

According to a second aspect there is provided a method that comprises receiving a drive signal at a capacitive sensor element, generating a first signal responsive to an object touching or coming into proximity of the capacitive sensor element, wherein the first signal is generated by the capacitive sensor element, and generating a second signal responsive to a dome being depressed, wherein the second signal is generated by a capacitor circuit comprising the capacitive sensor element.

According to a third aspect there is provided a mobile device comprising an apparatus according to the first aspect.

In the apparatus, method, and mobile device described above, a first signal is generated responsive to an object touching or coming into proximity of a capacitive sensor element, and a second signal is generated responsive to a dome, acting as a switch being depressed. The first signal and the second signal may be used to determine, whether a touch key or a press key has been activated by a user.

Various exemplary embodiments of the present invention are illustrated hereinafter in the detailed description of the invention as well as in the dependent claims appended hereto. The embodiments are illustrated with reference to selected aspects of the invention. A person skilled in the art appreciates that any embodiment of the invention may apply to other aspects as well either alone or in combination with other embodiments.

BRIEF DESCRIPTION OF THE DRAWINGS

The invention will be described, by way of example only, with reference to the accompanying drawings, in which:

FIG. 3A shows a simplified schematic view of an apparatus according to a further exemplary embodiment;

FIG. 3B shows a simplified schematic view of an apparatus according to yet another exemplary embodiment.

DETAILED DESCRIPTION

In the following description, like numbers denote like elements.

Figure 1A:
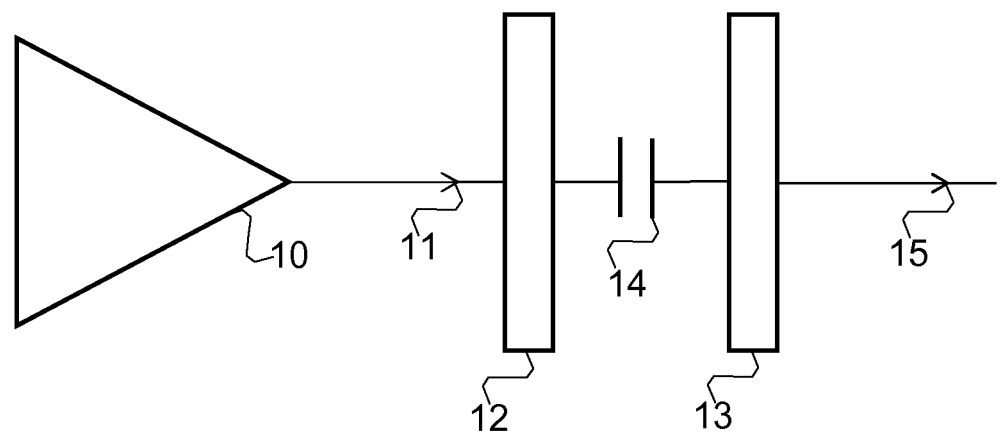
FIG. 1A shows a simplified schematic illustration of a capacitive sensor element arrangement utilized in at least one embodiment of the invention.

FIG. 1A shows a simplified schematic illustration of a capacitive sensor element arrangement utilized in at least one embodiment. FIG. 1A depicts a signal generator 10, a first electrode 12 driven by the signal generator 10, and a second electrode 13. The first electrode 12 may also be called a driven electrode, and the second electrode 13 may be called a receiving electrode. FIG. 1A further depicts an input lead 11 carrying an input signal to the first electrode 12, and an output lead 15 carrying an output signal from the second electrode 13 to a signal measurement circuit or the like (not shown). FIG. 1A further shows a coupling capacitor 14 that provides an electric coupling between the first electrode 12 and the second electrode 13.

The signal generator 10 may be configured to generate e.g. a plurality of periodic voltage pulses, which may be represented by a suitable waveform, such as rectangular, triangular, sinusoidal, or the like.

Figure 1B:
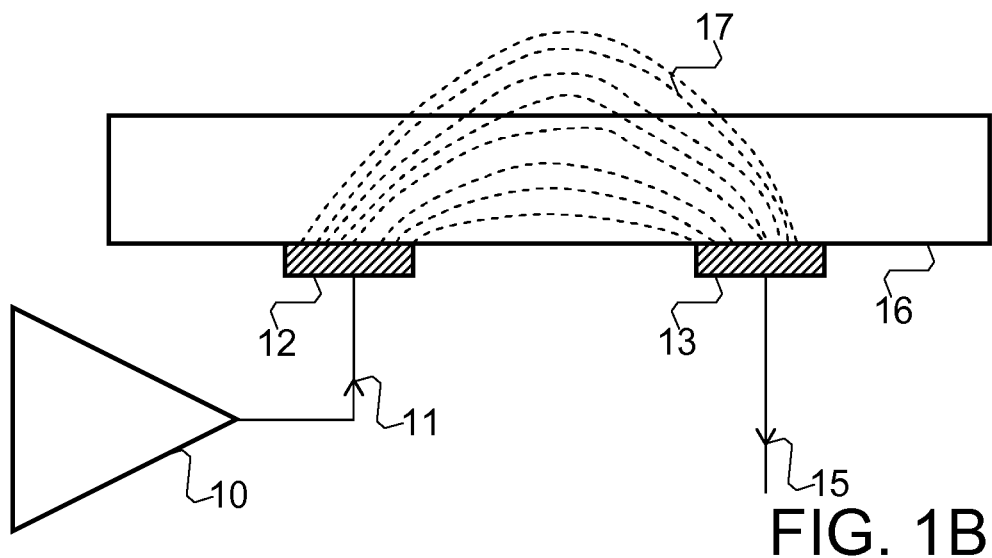
FIG. 1B shows another simplified schematic illustration of a capacitive sensor element arrangement.

FIG. 1B shows another simplified schematic illustration of a capacitive sensor element arrangement corresponding to that of FIG. 1A. FIG. 1B shows the signal generator 10, the input lead 11, the first electrode 12, the second electrode 13, and the output lead 15. FIG. 1B further shows an electric field 17 generated between the first electrode 12 and the second electrode 13 responsive to the input signal, such as the periodic voltage pulses generated by the signal generator 10. As is appreciated by a skilled person, periodic voltage pulses generate a changing electric field. FIG. 1B also shows a layer 16 of dielectric material or substrate supporting the first electrode 12 and the second electrode 13. The second electrode 13 receives the electric field 17 generated in the dielectric layer 16 via the coupling capacitance 14 shown in FIG. 1A.

Figure 1C:
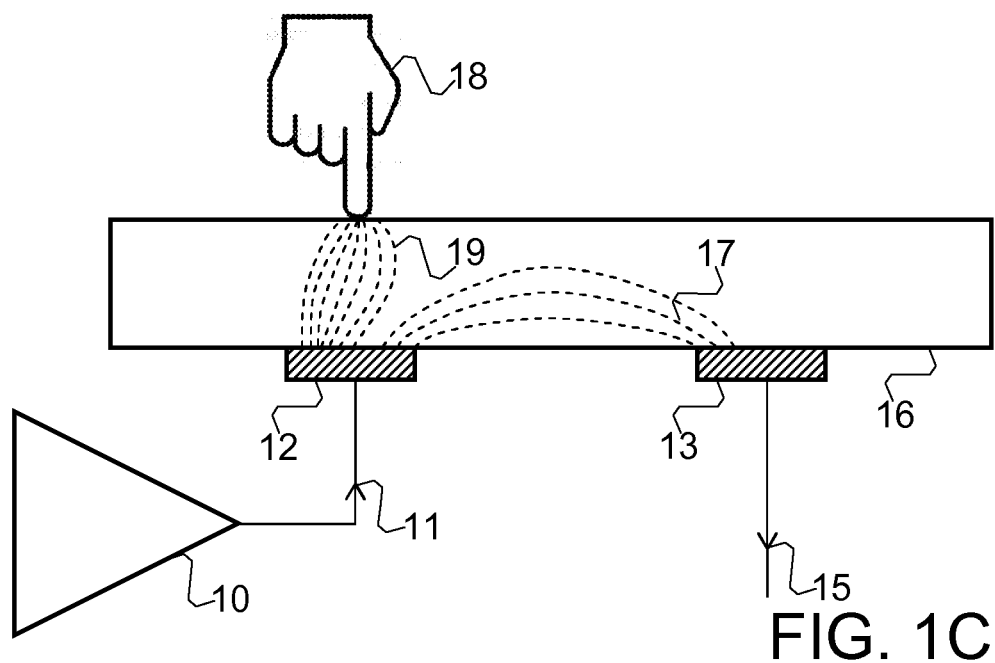
FIG. 1C shows yet another simplified schematic illustration of a capacitive sensor element arrangement.

FIG. 1C shows yet another simplified schematic illustration of a capacitive sensor element arrangement corresponding to those of FIGS. 1A and 1B. FIG. 1B depicts the capacitive sensor element in a situation, where an object 18, such as a user's finger, is touching or has been brought into proximity with the first electrode 12 and/or the second electrode 13. The object 18 may be e.g. brought into contact with the dielectric layer 16.

As shown in FIG. 1C, the object 18 absorbs a portion 19 of the electric field, and the original electric field 17 has lower energy compared to the situation where the object 18 is not present. In other words, a portion of the electric field 17 is coupled to the object 18 via another coupling capacitance (not shown), and a signal, the energy of which corresponds to the absorbed portion 19 is coupled to earth via e.g. a stray capacitance of the object 18. This results in a situation, where the energy of the output signal carried over the output lead 15 to a signal measurement circuit is lower as compared to the situation where the object 18 is not present. Thus, the signal measurement circuit may generate an indication of the presence of the object 18 on the basis of the decreased energy of the output signal.

Figure 1D:
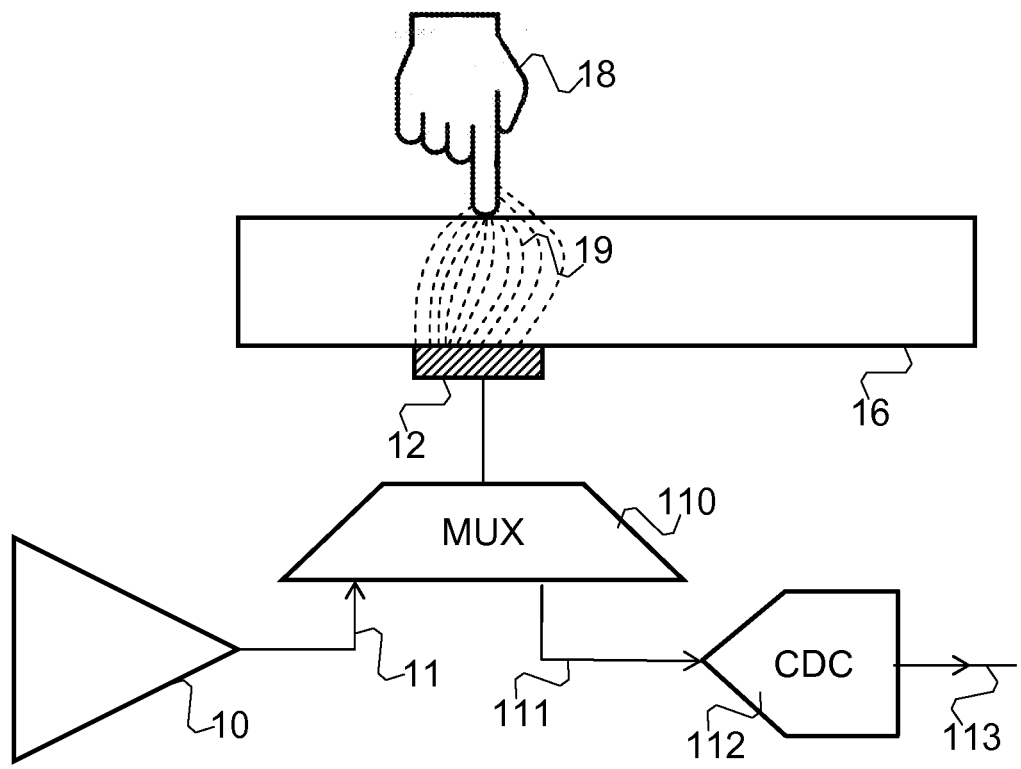
FIG. 1D shows a simplified schematic illustration of a single electrode capacitive sensor element.

FIG. 1D shows a simplified schematic illustration of a single electrode capacitive sensor element. FIG. 1D shows the signal generator 10, the input lead 11, the electrode 12, and the dielectric layer 16. The arrangement of FIG. 1D further comprises a multiplexer 110, a capacitance-to-digital converter (CDC) 112, a CDC input lead 111, and a CDC output lead 113.

As shown in FIG. 1D, an input signal generated by the signal generator 10 and conveyed by the input lead 11, and a CDC input signal conveyed by the CDC input lead 111 are multiplexed to the single electrode 12 by the multiplexer 110.

In an idle mode, i.e. when no objects are touching or in proximity of the electrode 12, the input signal 11 may convey a voltage to the electrode 12, but as there is a small stray capacitance between the electrode 12 and open space, there may be no electric current flowing through the stray capacitance, and therefore the stray capacitance may not be charged by the input signal in the idle mode.

Once an object 18, such as a user's finger, is brought into contact or proximity with the electrode 12, an electric field 19 is coupled from the electrode 12 to the object 18, and an electric current is conveyed via a coupling capacitance between the electrode 12 and the object 18, as well as the object's stray capacitance. In other words, the object 18 acts as a second electrode, forming a capacitor with the electrode 12. The object 18 increases the capacitance of the circuit.

The charge built in the capacitor formed by the coupling capacitance and the stray capacitance may be discharged by an electric current, or capacitance signal carried via the multiplexer 110 and the CDC input lead 11 to the CDC 112. The CDC may measure the capacitance, or detect a change in the capacitance of the circuit by using the capacitance signal. The CDC 112 may output data on the capacitance in digital form via the CDC output lead 113.

Figure 2A:
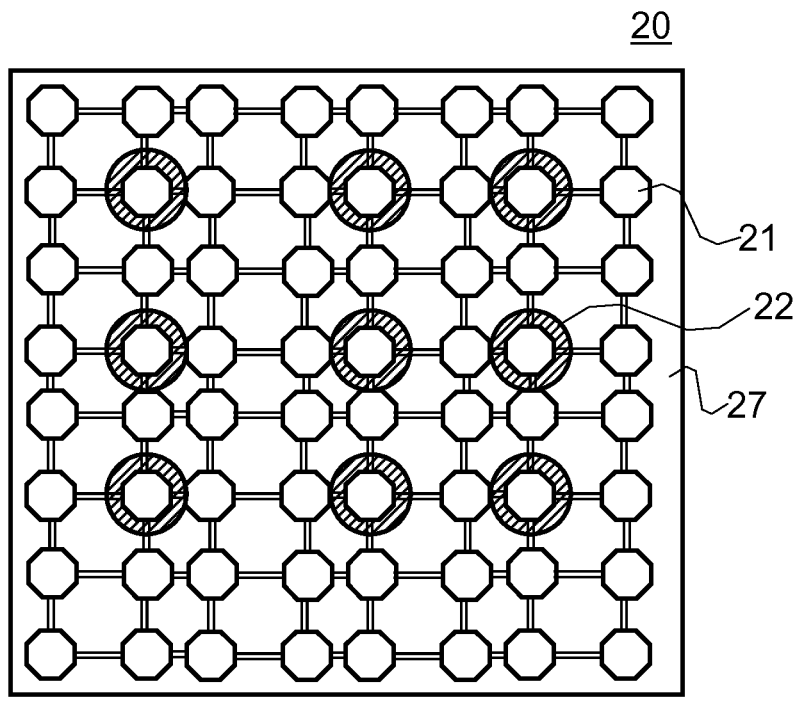
FIG. 2A depicts a simplified schematic view of an apparatus according to an exemplary embodiment.

FIG. 2A depicts a simplified schematic view of an apparatus according to an exemplary embodiment. The apparatus 20 shown in FIG. 2A comprises a substrate 27, a plurality of capacitive sensor elements 21 embodied on the substrate 27, and a plurality of domes 22.

The substrate may be e.g. a plate or board made of polyethylene terephthalate (PET), polyester, polytetrafluoroethylene (PTFE), and glass. The substrate may e.g. form a part of a flexible printed circuit board.

Each of the capacitive sensor elements 21 may be of the type described hereinbefore with reference to FIGS. 1A to 1D. The domes 22 may be e.g. metal domes embodied on a dome sheet placed under the substrate 27 or embodied as a layer on the substrate 27. The substrate 27 and the domes 22 may form a part of e.g. a keyboard or keypad assembly to be used in an electronic device, such as a mobile phone, a remote control device, a music player, a personal digital assistant, a handheld computer, a game console, or the like.

The capacitive sensor elements 21 may be representative of touch key positions, and the domes 22 may be representative of press key positions of a keypad. In other words, the embodiment shown in FIG. 2A enables the implementation a both touch keys and press keys using a common substrate 27.

The number of the capacitive sensor elements 21, as well as the domes 22, may vary according to e.g. design choices and a specification of an electronic device. For example, the embodiment of FIG. 2A may be configured such that the domes 22, i.e. the press keys, represent the number keys of a mobile phone, and the capacitive sensor elements 21 represent the character keys of a QWERTY keypad. In such exemplary configuration, the number of the capacitive sensor elements 21 is larger than the number of the domes 22.

Figure 2B:
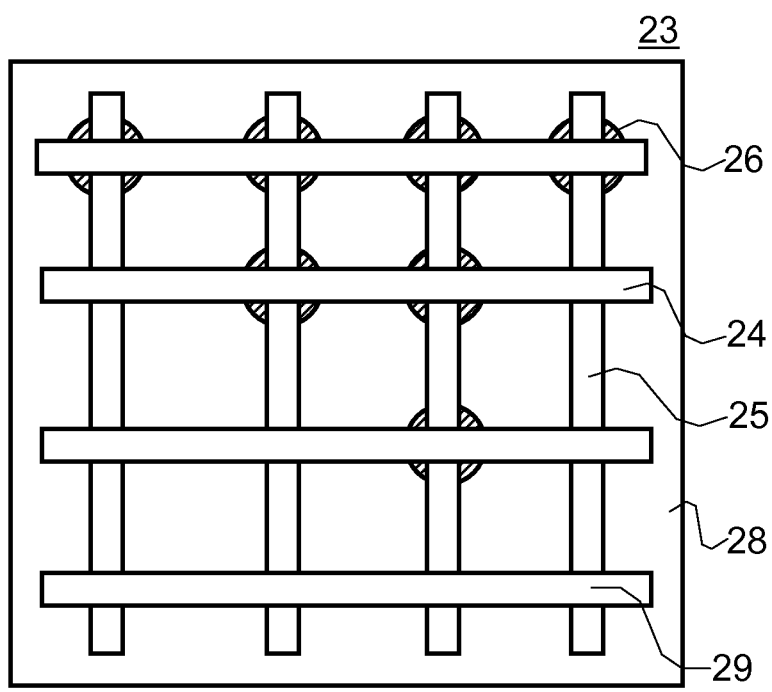
FIG. 2B shows a simplified schematic view of an apparatus according to another exemplary embodiment.

FIG. 2B shows a simplified schematic view of an apparatus according to another exemplary embodiment. The apparatus 23 of FIG. 2B comprises a substrate 28, a plurality of driven electrode lines 24, a plurality of receiving electrode lines 25, and a plurality of domes 26.

In the embodiment shown in FIG. 2B, a capacitive sensor element may be formed at an intersection 29 of a driven electrode line 24 and a receiving electrode line 25 that are embodied on a substrate 28. Thus, a changing electric field is generated at the intersections 29 of the receiving electrode lines 24 and the receiving electrode lines 25, if the driven electrode lines are driven with voltage pulses. A capacitive sensor element may also be formed by an electrode line and an object touching it in a manner described hereinbefore with reference to FIG. 1D. In a similar manner as described hereinbefore in connection with FIGS. 1A to 1D, the changing electric field at each intersection of the driven electrode lines 24 and the receiving electrode lines 25 is received by the receiving electrode lines 25, e.g. the portions of the receiving electrode lines that are overlapped by the driven electrode lines 24, via respective coupling capacitances (not shown). The changing electric field may also be present between an electrode line and an object touching the electrode line. Also in a similar manner as described hereinbefore, output signals are generated on the receiving electrodes 25, or the electrode touched by the object, and carried to signal measurement circuit(s) in order to determine, whether an object has been brought into proximity of any of the capacitive sensor elements formed at the intersections or other locations on the driven electrode lines 24 and the receiving electrode lines 25.

The capacitive sensor elements formed at the intersections of the driven electrode lines 24 and the receiving electrode lines 25, or the sensor elements formed by the electrode lines and objects that are touching the electrode lines, may be representative of touch key positions, and the domes 26 may be representative of press key positions of a keypad. In other words, the embodiment shown in FIG. 2B also enables the implementation a both touch keys and press keys using a common substrate 28.

The number of the capacitive sensor elements formed e.g. at the intersections of the driven electrode lines 24 and the receiving electrode lines 25, i.e. the number of the driven and receiving electrode lines, as well as the number of the domes 26, may vary according to e.g. design choices and a specification of an electronic device. For example, the embodiment of FIG. 2B may be configured such that the domes 26, i.e. the press keys, represent the number keys of a mobile phone, and the capacitive sensor elements represent the character keys of a QWERTY keypad. In such exemplary configuration, the number of the capacitive sensor elements is larger than the number of the domes 26.

In a similar manner as in the embodiment of FIG. 2A, the domes 26 may be e.g. metal domes embodied on a dome sheet placed under the substrate 28 or embodied as a layer on the substrate 28. The substrate 28 and the domes 26 may form a part of e.g. a keyboard or keypad assembly to be used in an electronic device, such as a mobile phone, a remote control device, a music player, a personal digital assistant, a handheld computer, a game console, or the like.

FIG. 3A shows a simplified schematic view of an apparatus 30 according to a further exemplary embodiment. FIG. 3A shows a plurality of driven electrode lines 33 and receiving electrode lines 34 corresponding to those discussed hereinbefore with reference to FIG. 2B. FIG. 3A further shows an example of a capacitive circuit that is coupled to a driven electrode line 33 and a receiving electrode line 34. Three capacitive circuits are shown in the exemplary embodiment of FIG. 3A, but a skilled person appreciates that a corresponding capacitive circuit is provided for each driven electrode line-receiving electrode line pair.

The exemplary capacitive circuit depicted in FIG. 3A comprises a capacitor 31 and a dome 32, wherein the dome 32 operates as a switch in the circuit. Closing the switch by depressing the dome 32 completes the electric circuit comprising the capacitor 31, which results in the capacitor 32 being coupled to the coupling capacitance between a driven electrode line 33 and a receiving electrode line 34 in a parallel arrangement. Alternatively, in a single-electrode capacitive sensor case, the capacitor 31 may be dimensioned such that closing the switch produces a higher capacitance signal level than that produced by the coupling capacitance between the electrode line and the object touching or being in proximity of the electrode line. In other words, the capacitor 31 is dimensioned such that closing the switch changes the capacitance of the circuit as compared to the touching of the capacitive sensor element.

FIG. 3B shows a simplified schematic view of an apparatus 30 according to yet another exemplary embodiment. FIG. 3B also shows a plurality of driven electrode lines 33 and receiving electrode lines 34 corresponding to those discussed hereinbefore with reference to FIG. 2B. FIG. 3B further shows another example of a capacitive circuit that is coupled to a driven electrode line 33 and a receiving electrode line 34. Three capacitive circuits are shown in the exemplary embodiment of FIG. 3B, but a skilled person appreciates that a corresponding capacitive circuit is provided for each driven electrode line-receiving electrode line pair.

The exemplary capacitive circuit depicted in FIG. 3B comprises two capacitors 35, 36 coupled to a parallel arrangement with respect to each other. As shown in FIG. 3B, one plate/electrode of the capacitor 35 is coupled to the receiving electrode line 34, and one plate/electrode of the capacitor 36 is coupled to the driven electrode line 34. The other plates/electrodes of the capacitors 35, 36 are coupled together forming a coupling point. A dome 32, operating as a switch, is provided for coupling the coupling point to signal ground responsive to the dome being depressed. In a similar manner as in the arrangement described with reference to FIG. 3A, the capacitors 35, 36 may be dimensioned such that closing the switch changes the capacitance of the circuit as compared to the capacitive circuit formed when an object touches or is in proximity of the capacitive touching sensor.

FIGS. 3A and 3B show an exemplary embodiment, where capacitive sensor elements are formed in intersections of electrode lines, but the capacitive circuit arrangements illustrated in said Figures are equally applicable to embodiments where the capacitive sensor elements are of the type illustrated e.g. in FIG. 2A.

In the exemplary embodiments depicted in FIGS. 3A and 3B, a capacitive sensor element may also be formed at a location on any of the electrode lines, where an object touches or is in proximity of the electrode line. In this case, the function of the capacitive sensor elements corresponds to that of the capacitive sensor element described hereinbefore with reference to FIG. 1D. For example, if a touching object is located such that it touches both the electrode line 33 and the electrode line 34, the object is coupled to both said electrode lines via a respective coupling capacitance in a manner described hereinbefore with reference to FIG. 1D, and the object's location may be determined. Determination of an object's location in this type of arrangement is discussed e.g. in U.S. Pat. No. 6,970,126.

The apparatus 30 shown in FIGS. 3A and 3B may further comprise a controller that is configured to receive the signals generated by the capacitive sensor elements and/or the capacitive circuits, and to determine on the basis of the signal(s), whether an object is in proximity of any of the capacitive sensor elements, or whether a dome representing a press key have been depressed. The controller may be e.g. a programmable, commercial off-the-shelf controller, such as an AD7147 or Atmel AtMega controller.

The capacitors depicted in FIGS. 3A and 3B may be e.g. separate capacitor components, or they may be embodied on e.g. a substrate forming part of a flexible printed circuit board.

Figure 4:
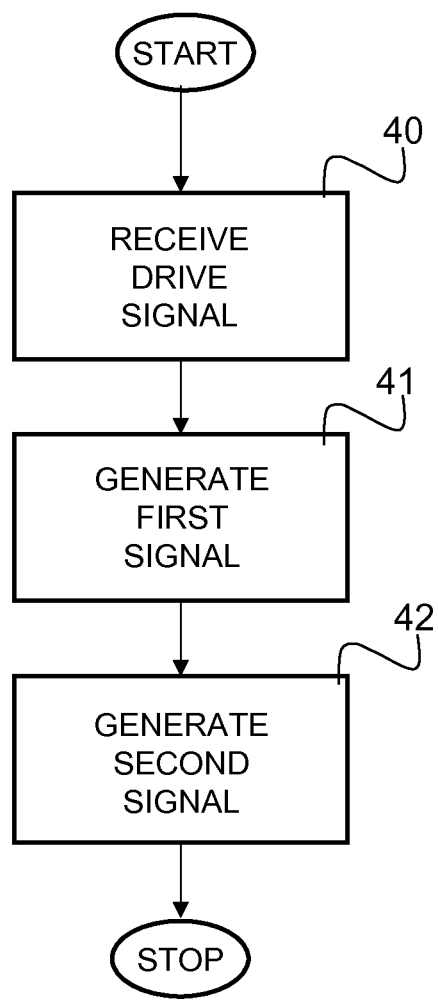
FIG. 4 depicts a method according to an exemplary embodiment.

FIG. 4 illustrates a method according to an exemplary embodiment. In step 40, a drive signal is received in a capacitive sensor element. The capacitive sensor element may be e.g. one that has been discussed hereinbefore with reference to FIGS. 1 to 3 and receive the drive signal in a corresponding way.

In step 41, a first signal may be generated responsive to an object touching or coming into proximity of the capacitive sensor element, wherein the first signal is generated by the capacitive sensor element. The first signal may be generated e.g. in a manner described hereinbefore with reference to FIG. 1C.

In step 42, a second signal may be generated responsive to a dome being depressed, wherein the second signal is generated by a capacitor circuit comprising the capacitive sensor element. The second signal may be generated e.g. in a manner described hereinbefore with reference to FIGS. 3A and 3B.

The method illustrated in FIG. 4 may further comprise the steps of receiving the first signal at a controller and determining on the basis of the first signal, that a key touch action is performed. The determination may be carried out by the controller in a manner described hereinbefore.

The method of FIG. 4 may further comprise the steps of receiving the second signal at a controller and determining on the basis of the second signal, that a key press action is performed. The determination may be carried out by the controller in a manner described hereinbefore.

The embodiments described herein may eliminate the need of having dedicated flexible printed circuit boards and controllers for touch keys and press keys by enabling the implementation of both touch keys and press keys on a common flexible printed circuit board controlled by a common controller. Implementation of both key types on a common flexible printed circuit board controlled by one controller may result in smaller keypad assemblies in size, especially thinner keypad assemblies, and cost reductions. Such keypad assemblies may be used e.g. in mobile devices.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description shall be considered as merely illustrative of the principles of the present invention, and not in limitation thereof. Hence, the scope of the invention is only restricted by the appended patent claims.

We claim:

1. An apparatus comprising:
   a substrate;
   a dome supported by the substrate; and
   a capacitor circuit supported by the substrate and comprising:
     a capacitive sensor element, said capacitive sensor element having a first electrode and a second electrode that are in the capacitor circuit, the capacitive sensor element being configured to form a first capacitor with an object touching or being in proximity of the first electrode;
     an output for producing to a controller an output signal indicative of the object touching or being in proximity of the first electrode;
     wherein the capacitive sensor element is configured to generate the output signal responsive to the object touching or coming into proximity of the capacitive sensor element; and
   wherein, the capacitor circuit comprises two serially connected capacitors one of which comprises the third electrode and the fourth electrode,
   wherein the third electrode is coupled to the second electrode and the fourth electrode is coupled to a switch; and
   the remaining one of the two serially connected capacitors comprises a fifth electrode coupled to the fourth electrode and a sixth electrode coupled to the first electrode; and
   wherein the dome is configured to modify by closing the switch, responsive to the dome being depressed, capacitance of the capacitor circuit so as to modify the output signal indicative of the dome being depressed.

2. The apparatus of claim 1, wherein the dome is configured to modify, responsive to the dome being depressed, the capacitance of the capacitor circuit by forming a coupling of the fourth electrode through the switch to the first electrode or to ground so as to modify the output signal.

3. The apparatus according to claim 1, wherein the switch is configured to ground the fourth and fifth electrodes responsive to the dome being depressed.

4. The apparatus according to claim 1, comprising a first line and a second line;
   wherein the capacitive sensor element is formed at an intersection of the first line and the second line;
   wherein the first electrode comprises a portion of the first line and the second electrode comprises a portion of the second line; and
   wherein said portion of the first line substantially overlaps said portion of the second line.

5. The apparatus according to claim 1, wherein the capacitor circuit is configured to form the capacitive sensor element at a location where the object touches or is in proximity of the first electrode.

6. The apparatus according to claim 1, further comprising:
   the controller;
   wherein the controller is configured to receive and process the output signal and to determine on the basis of the output signal whether a key touch action or a key press action is performed.

7. The apparatus according to claim 1, wherein the capacitor circuit comprises at least one capacitor component.

8. The apparatus according to claim 1, wherein the capacitor circuit is embodied on the substrate.

9. The apparatus according to claim 1, wherein the substrate is made of a material selected from a group consisting of polyethylene terephthalate, polyester, polytetrafluoroethylene, and glass.

10. The apparatus of claim 6 wherein the output signal is a capacitive signal.

11. A mobile device comprising:
    a substrate;
    a dome supported by the substrate; and
    a capacitor circuit supported by the substrate and comprising:
      a capacitive sensor element, said capacitive sensor element having a first electrode and a second electrode that are in the capacitor circuit, the capacitive sensor element being configured to form a first capacitor with an object touching or being in proximity of the first electrode;
      an output for producing to a controller an output signal indicative of the object touching or being in proximity of the first electrode;
      wherein the capacitive sensor element is configured to generate the output signal responsive to the object touching or coming into proximity of the capacitive sensor element; and
    wherein, the capacitor circuit comprises two serially connected capacitors one of which comprises the third electrode and the fourth electrode,
    wherein the third electrode is coupled to the second electrode and the fourth electrode is coupled to a switch; and
    the remaining one of the two serially connected capacitors comprises a fifth electrode coupled to the fourth electrode and a sixth electrode coupled to the first electrode;
    wherein the dome is configured to modify by closing the switch, responsive to the dome being depressed, capacitance of the capacitor circuit so as to modify the output signal indicative of the dome being depressed.

12. The mobile device of claim 11, wherein the mobile device further comprises a wireless device.

13. The mobile device of claim 11 further comprising the controller;
    wherein the controller is configured to receive and process the output signal and to determine on the basis of the output signal whether a key touch action or a key press action is performed.

14. The mobile device of claim 13, wherein the output signal is a capacitive signal.

* * * * *